United States Patent
Nakatani et al.

(10) Patent No.: US 11,183,346 B2
(45) Date of Patent: Nov. 23, 2021

(54) INPUT DEVICE

(71) Applicant: Panasonic Intellectual Property Management Co., Ltd., Osaka (JP)

(72) Inventors: Go Nakatani, Kyoto (JP); Hideaki Eto, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 17/080,417

(22) Filed: Oct. 26, 2020

(65) Prior Publication Data

US 2021/0134540 A1 May 6, 2021

(30) Foreign Application Priority Data

Oct. 30, 2019 (JP) .............................. JP2019-197075
May 29, 2020 (JP) .............................. JP2020-094012

(51) Int. Cl.
*H01H 9/16* (2006.01)
*H03K 17/96* (2006.01)

(52) U.S. Cl.
CPC .......... *H01H 9/161* (2013.01); *H03K 17/962* (2013.01); *H01H 2219/062* (2013.01); *H01H 2239/006* (2013.01); *H03K 2017/9606* (2013.01); *H03K 2217/96079* (2013.01)

(58) Field of Classification Search
CPC ............. H01H 9/161; H01H 2219/062; H01H 2239/006; H03K 17/962
USPC ........................................................ 200/314
See application file for complete search history.

(56) References Cited

U.S. PATENT DOCUMENTS

| | | | | |
|---|---|---|---|---|
| 2009/0090605 | A1* | 4/2009 | Arione ................. | H03K 17/962 200/314 |
| 2014/0374232 | A1* | 12/2014 | Hanada ................ | H03K 17/962 200/600 |

FOREIGN PATENT DOCUMENTS

JP          6079469          2/2017

* cited by examiner

*Primary Examiner* — Edwin A. Leon
*Assistant Examiner* — Iman Malakooti
(74) *Attorney, Agent, or Firm* — Greenblum & Bernstein, P.L.C.

(57) ABSTRACT

An input device includes: a substrate; a first detection electrode that detects input to the input device; a light emitter that emits light when the input is performed; a body plate disposed on the front surface side of the substrate and through which the light is transmitted; and a light guide including an incident surface from which the light enters and a light exit surface from which the light entered from the incident surface exits. A design portion that is light transmissive is disposed on an opposite side of the body plate to the substrate. A penetration hole penetrates through the substrate at a position opposite the design portion. The light guide is disposed in the penetration hole with the incident surface oriented facing a light emitting surface of the light emitter and the light exit surface oriented facing the design portion with the body plate interposed therebetween.

12 Claims, 6 Drawing Sheets

INPUT DEVICE

CROSS REFERENCE TO RELATED APPLICATIONS

The present application is based on and claims priority of Japanese Patent Application No. 2019-197075 filed on Oct. 30, 2019, and Japanese Patent Application No. 2020-094012 filed on May 29, 2020.

FIELD

The present disclosure relates to an input device.

BACKGROUND

Patent Literature (PTL) 1 discloses a conventional touch switch device equipped with a lighting device that includes: a wiring substrate having a flat-plate shape, and having a detection electrode on one surface side and a light-emitting element on the other surface side; and a light guide plate disposed on the one surface side of the wiring substrate for emitting light introduced from the light-emitting element to outside from an operation surface located on the opposite side to the wiring substrate. The light guide plate has a light guide plate main body disposed to cover the detection electrode, and an extending portion that extends from the light guide plate main body to the other surface side of the wiring substrate and guides the light emitted by the light-emitting element to the light guide plate main body.

CITATION LIST

Patent Literature

PTL 1: Japanese Patent No. 6079469

SUMMARY

The input device according to PTL 1 can be improved upon.

In view of this, an input device according to one aspect of the present disclosure is capable of improving upon the above related art.

An input device according to one aspect of the present disclosure includes: a substrate; a first detection electrode that is disposed on a front surface of the substrate and detects input to the input device; a light emitter that is disposed on a back surface of the substrate and emits light along a direction parallel to the back surface when the input to the input device is performed; a body plate that is disposed on the front surface side of the substrate and through which light emitted by the light emitter is transmitted; and a light guide that includes an incident surface from which light emitted by the light emitter enters and a light exit surface from which the light entered from the incident surface exits. A design portion that is light transmissive is disposed on an opposite side of the body plate to the substrate, a penetration hole penetrates through the substrate at a position opposite the design portion via the body plate, and the light guide is disposed in the penetration hole with the incident surface oriented facing a light emitting surface of the light emitter and the light exit surface oriented facing the design portion with the body plate interposed between the light exit surface and the design portion.

Note that these comprehensive or specific aspects of the present disclosure may be implemented as a system, a method, an integrated circuit, a computer program, or a computer-readable recording medium such as a CD-ROM, or may be implemented as any combination of a system, a method, an integrated circuit, a computer program, and a recording medium. The recording medium may be a non-transitory recording medium.

An input device according to one aspect of the present disclosure is capable of improving upon the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

DESCRIPTION OF EMBODIMENT

Figure 1:
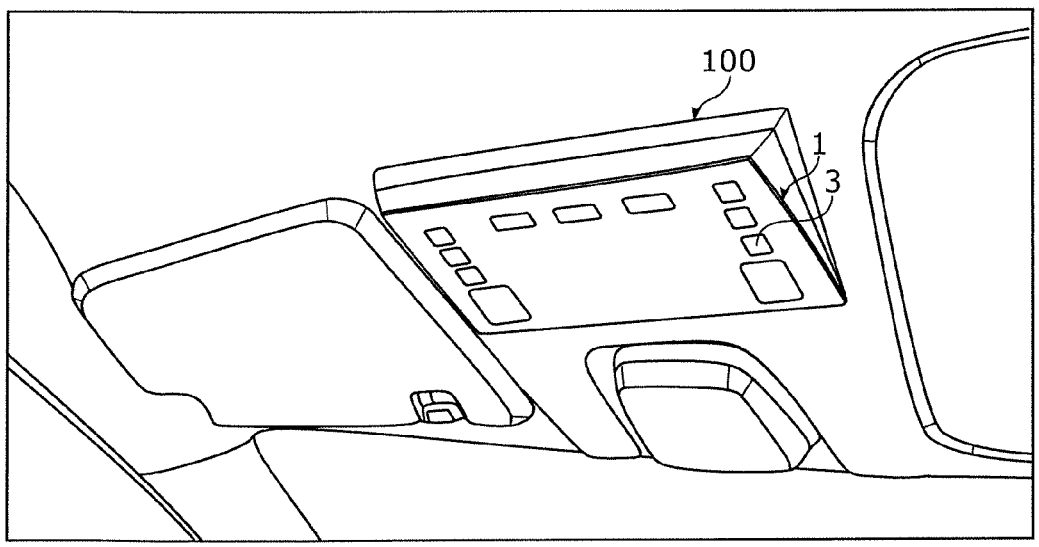
FIG. 1 is a perspective view illustrating an example of a storage box including an input device according to an embodiment.

The conventional light guide plate guides light emitted by a light emitter to a design portion via the extending portion and the light guide plate main body so that the light is emitted through the design portion, which is located on the front surface side. Accordingly, the optical path length from the light emitter to the design portion increases, and this may reduce the brightness of light emitted through the design portion. Moreover, when there are a plurality of design portions, the optical path lengths from light emitters to the design portions are mutually different. Thus, a design portion through which bright light is emitted and a design portion through which dark light is emitted are both present. Therefore, the luminance of light emitted through the respective design portions becomes uneven.

In view of the above, an input device according to one aspect of the present disclosure includes: a substrate; a first detection electrode that is disposed on a front surface of the substrate and detects input to the input device; a light emitter that is disposed on a back surface of the substrate and emits light along a direction parallel to the back surface when the input to the input device is performed; a body plate that is disposed on the front surface side of the substrate and through which light emitted by the light emitter is transmitted; and a light guide that includes an incident surface from which light emitted by the light emitter enters and a light exit surface from which the light entered from the incident surface exits. A design portion that is light transmissive is disposed on an opposite side of the body plate to the substrate, a penetration hole penetrates through the substrate at a position opposite the design portion via the body plate, and the light guide is disposed in the penetration hole with the incident surface oriented facing a light emitting surface of the light emitter and the light exit surface oriented facing the design portion with the body plate interposed between the light exit surface and the design portion.

With this, the penetration hole is formed in the substrate at a position opposite the design portion via the body plate. Since the light guide is disposed in the penetration hole, the light emitted by the light emitter disposed on the back surface of the substrate passes through the penetration hole and the body plate via the light guide, and is guided to the design portion. Accordingly, increase in the optical path length from the light emitter to the design portion is suppressed in the input device.

Therefore, it is possible to suppress luminance unevenness of light emitted through the design portion in the input device.

In particular, when the input device is manufactured, the substrate on which the light emitter, the first detection electrode, etc. are disposed is put into a die, and the body plate is formed by insert molding using a resin material to obtain the input device. In this case, the light emitter is disposed on the back surface of the substrate. With this, the light emitter is less likely to be affected by a highly-heated and highly-pressured molten resin material.

Furthermore, in the input device according to another aspect of the present disclosure, the first detection electrode is disposed along an inner periphery of the penetration hole.

With this, the first detection electrode is provided near the penetration hole. This ensures detection of a touch by, for example, a user's finger on the design portion.

Furthermore, in the input device according to another aspect of the present disclosure, the first detection electrode has a loop shape surrounding the penetration hole and is disposed on the front surface of the substrate.

This enables more reliable detection of a touch on the design portion by a user's finger, even when the user's finger touches a position slightly deviated from the design portion, for example.

Furthermore, in the input device according to another aspect of the present disclosure, the light guide includes an inclined surface that faces the incident surface and the light exit surface, and the inclined surface is a reflective surface that reflects, to the light exit surface, light that enters the incident surface and passes through the light guide.

With this, the inclined surface reflects light that enters from the incident surface and passes through the light guide to the light exit surface. The light reflected off the inclined surface is guided to the design portion via the light exit surface and the body plate. Therefore, the design portion emits bright light. As a result, the design (pattern) on design portion appears.

Furthermore, in the input device according to another aspect of the present disclosure, on the inclined surface, a reflective member that reflects light that passes through the light guide is disposed or light reflective processing for reflecting light that passes through the light guide is performed.

With this, the inclined surface reliably reflects, to the light exit surface, light that enters from the incident surface and passes through the light guide. Therefore, the light reflected off the inclined surface is guided to the design portion via the light exit surface and the body plate. Therefore, the design portion emits brighter light. As a result, the design (pattern) on the design portion appears clearly.

Furthermore, in the input device according to another aspect of the present disclosure, on surfaces other than the incident surface and the light exit surface, a reflective member that reflects light that passes through the light guide is disposed or light reflective processing for reflecting light that passes through the light guide is performed.

With this, not only the inclined surface but also surfaces other than the incident surface and the light exit surface of the light guide can reflect light that enters from the incident surface and passes through light guide. Therefore, the light that enters from the incident surface and passes through the light guide can be collected on the light exit surface. With this, more light can be collected into the design portion via the light exit surface and the body plate. Therefore, the design portion emits bright light more reliably. As a result, the design portion emits bright light, and thus the pattern on design portion appears more clearly.

Furthermore, in the input device according to another aspect of the present disclosure, the body plate is a portion interposed between the design portion and the light exit surface of the light guide, and includes a light-transmissive portion that has a light transmissive property and a non-light-transmissive portion that has a non-light-transmissive property and constitutes a portion other than the light-transmissive portion.

With this, the light-transmissive portion is disposed at a position in which the light-transmissive portion overlaps the design portion and the light guide. Thus, the light exited from the light exit surface of the light guide can be reliably guided to the design portion. Moreover, the portion other than the light-transmissive portion is non-light-transmissive portion. Therefore, more light can be collected into the design portion opposite the light guide of the light-transmissive portion. Because the design portion emits bright light more reliably, the pattern on the design portion appears more clearly.

Furthermore, in the input device according to another aspect of the present disclosure, the body plate includes the light-transmissive portion and the non-light-transmissive portion that are integrally formed by multicolor molding.

With this structure, because the body plate can be manufactured by multicolor molding, the body plate is manufactured more easily than separately manufacturing the light-transmissive portion and the non-light-transmissive portion and combining the light-transmissive portion and the non-light-transmissive portion.

Furthermore, in the input device according to another aspect of the present disclosure, the light emitter is disposed at a position in which a normal direction of the light emitting surface is parallel to the back surface of the substrate and the light emitter overlaps the first detection electrode in a plan view of the substrate.

With this, the first detection electrode is disposed in the vicinity of the design portion to detect a touch on the design portion by a user's finger, for example, and the light emitter can be disposed near such a first detection electrode. In other words, in the input device, the light emitter can be disposed near the design portion. Accordingly, the optical path length from the light emitter to the design portion is less likely to increase. As a result, it is possible to further suppress luminance unevenness of light emitted through the design portion in the input device.

Furthermore, in the input device according to another aspect of the present disclosure, the reflective member is disposed on the inclined surface, the reflective member is a second detection electrode that is conductive, and the second detection electrode is electrically connected to the first detection electrode.

With this, the second detection electrode can be disposed also on the inclined surface of the light guide that faces the design portion. This increases the sensitivity of detecting a touch on the design portion by a user's finger. Accordingly, this increases the reliability of detecting a touch on the design portion by a user's finger.

Furthermore, in the input device according to another aspect of the present disclosure, a through hole that is electrically connected to the first detection electrode is provided in the substrate, and the second detection electrode is electrically connected to the through hole.

With this, the first detection electrode and the second detection electrode are electrically connected via the through hole. This makes it possible to use minimum wiring required to connect the first detection electrode and the second detection electrode, and minimize protrusion of the wiring which may occur by excessive drawing of the wiring. As a result, it is possible to maintain the thin structure of the input device.

The following specifically describes an embodiment according to the present disclosure with reference to the drawings. Note that the embodiment described below shows a general or specific example of the present disclosure. The numerical values, shapes, materials, structural elements, the arrangement and connection of the structural elements, etc. shown in the following embodiment are mere examples, and do not limit the scope of the present disclosure. Of the structural elements in the following embodiment, structural elements not recited in the independent claim are described as optional structural elements.

Furthermore, the figures are schematic diagrams and are not necessarily precise illustrations. Throughout the figures, structural elements that are essentially the same share like reference signs. Accordingly, duplicate description is omitted or simplified.

In the following embodiment, expressions such as "substantially parallel" are used. For example, "substantially parallel" means not only being completely parallel, but also means being practically parallel, i.e., allowing several percent of error, for example. Furthermore, "substantially parallel" means being parallel within the scope in which advantageous effects according to the present disclosure can be achieved. The same applies to other expressions using "substantially".

Furthermore, in the following description, a "front surface" is a surface on the side on which the input device is visually recognized (a positive side along the X-axis, and hereinafter, referred to as a positive direction of the X-axis), and a "back surface" is a surface on the opposite side (a negative side along the X-axis, and hereinafter, referred to as a negative direction of the X-axis). Furthermore, a direction that intersects the X-axis direction is defined as the Y-axis direction. A direction that intersects the X-axis direction and the Y-axis direction is defined as the Z-axis direction.

The following describes an input device according to an embodiment of the present disclosure.

EMBODIMENT

Figure 2:
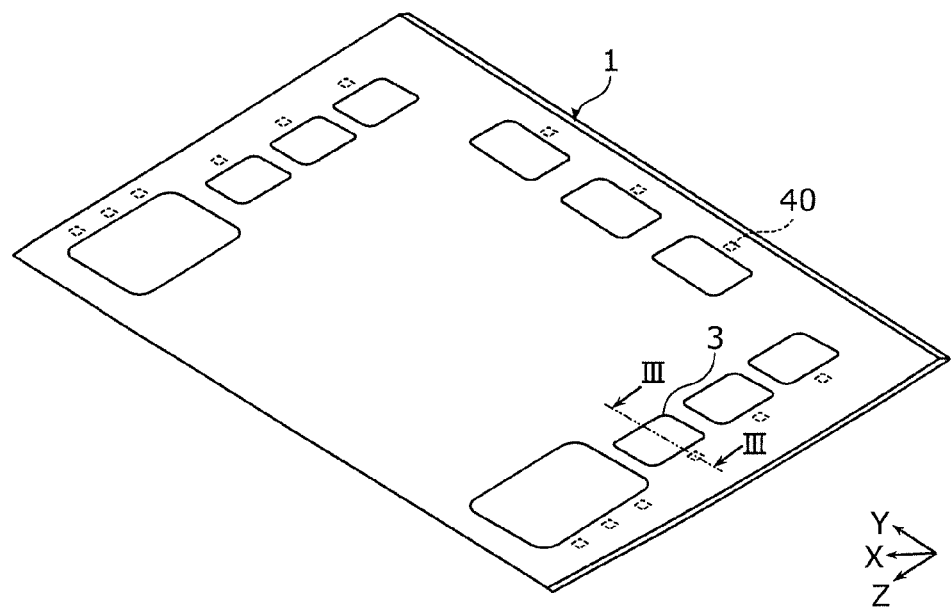
FIG. 2 is a perspective view illustrating an example of the input device according to the embodiment.

FIG. 1 is a perspective view illustrating an example of storage box 100 including input device 1 according to the embodiment. FIG. 1 illustrates an example of the inside of a vehicle. FIG. 2 is a perspective view illustrating an example of input device 1 according to the embodiment.

As illustrated in FIG. 1, storage box 100 is disposed on the inside of the vehicle. Storage box 100 stores glasses, a wallet, and so on. Storage box 100 is disposed, for example, on an elbow rest, an arm rest, a ceiling of the inside of the vehicle, etc. The location of storage box 100 is not particularly limited. It should be noted that storage box 100 may be disposed in an airplane, facility such as a house, etc., as well as the vehicle.

Storage box 100 includes input device 1.

For example, input device 1 has functions of opening and closing storage box 100, and turning on an illumination device in the vehicle, etc. Input device 1 also serves as the cover of storage box 100. Input device 1 automatically rotates by an input operation by a user, or is rotated manually by the user to open the storage space of storage box 100.

As illustrated in FIG. 2, input device 1 has operation interfaces 3 for performing such functions. Operation interfaces 3 are each a portion corresponding to design portion 63 in FIG. 3, which will be described below. A user touches operation interfaces 3 to enable the functions of input device 1.

A specific configuration of input device 1 will be described.

Figure 3:
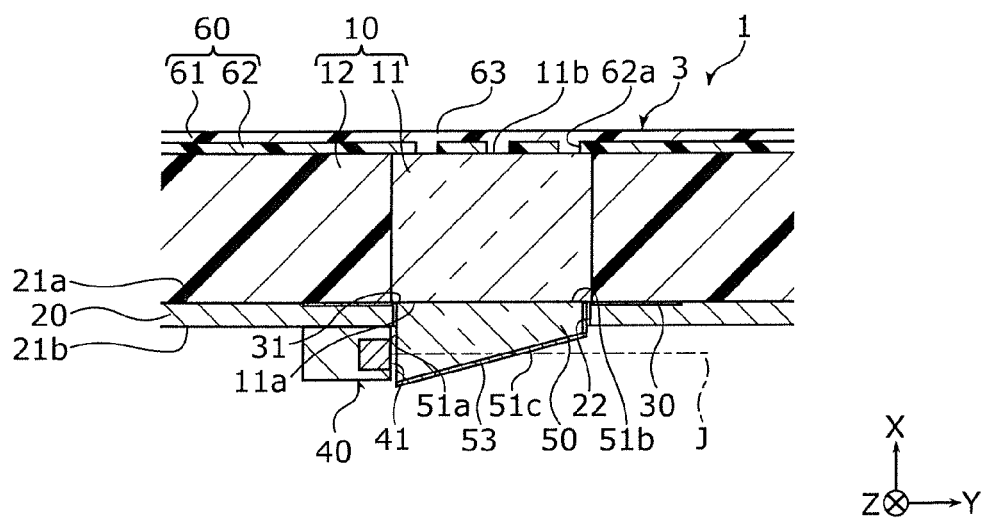
FIG. 3 is an exemplary cross-sectional view of the input device taken along the line III-III in FIG. 2.
Figure 4:
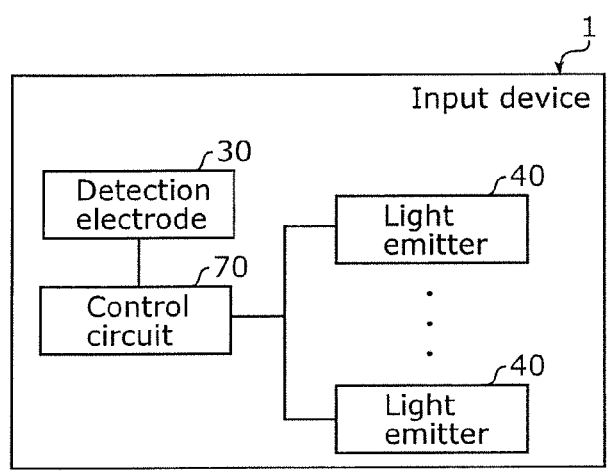
FIG. 4 is a block diagram illustrating the input device according to the embodiment.

FIG. 3 is an exemplary cross-sectional view of input device 1 taken along the line in FIG. 2. FIG. 4 is a block diagram illustrating input device 1 according to the embodiment.

As illustrated in FIG. 2 and FIG. 3, input device 1 is a plate panel. Input device 1 displays design portion 63. Design portion 63 is a pattern indicating, for example, opening and closing operations of the storage space of storage box 100 in FIG. 1, or light-on and light-off states of the illumination device. In FIG. 2, illustration of design portion 63 is omitted. The pattern to be displayed on design portion 63 is not particularly limited, and any pattern is possible.

As illustrated in FIG. 3 and FIG. 4, input device 1 includes body plate 10, substrate 20, first detection electrode 30, light emitter 40, light guide 50, front layer portion 60, and control circuit 70.

<Body Plate 10>

Body plate 10 is a light-transmissive plate through which light emitted from light emitter 40 is transmitted. Body plate 10 transmits light emitted from light emitter 40 disposed on substrate 20. The transmitted light exits from design portion 63.

Body plate 10 is disposed on the front surface 21a side of substrate 20 via first detection electrode 30 such that body plate 10 is substantially parallel to the Y-Z plane. In other words, body plate 10 is disposed on a surface in the positive direction of the X-axis with first detection electrode 30 being interposed between body plate 10 and substrate 20, and placed on the front surface 21a side of substrate 20. A surface in the negative direction of the X-axis of body plate 10 is in close contact with front surface 21a of substrate 20.

Body plate 10 is made of a transparent material, for example, a resin material such as an acrylic resin or polycarbonate.

Furthermore, body plate 10 includes light-transmissive portion 11 and non-light-transmissive portion 12. In the present embodiment, body plate 10 includes light-transmissive portion 11 and non-light-transmissive portion 12 that are integrally formed by multicolor molding. In the present embodiment, body plate 10 is formed by two-color extrusion molding (two color molding). Furthermore, in the present embodiment, light-transmissive portion 11 and non-light-transmissive portion 12 of body plate 10 are made of an identical resin material, but may be made of different resin materials having different properties. Note that light-transmissive portion 11 and non-light-transmissive portion 12 may be made of different resin materials.

Note that light-transmissive portion 11 and non-light-transmissive portion 12 may be separate components that can be detached from each other. Body plate 10 may be formed by combining light-transmissive portion 11 and non-light-transmissive portion 12.

Light-transmissive portion 11 is a portion interposed between design portion 63 and light exit surface 51b of light guide 50, and is light transmissive. When body plate 10 is viewed from the X-axis direction, light-transmissive portion 11 overlaps design portion 63 and light guide 50. Light exit surface 51b of light guide 50 is in close contact with first surface 11a of light-transmissive portion 11 that is located in the negative direction of the X-axis, and design portion 63 is disposed on second surface 11b of light-transmissive portion 11 that is located in the positive direction of the X-axis.

Light-transmissive portion 11 has a shape and a size corresponding to the shape and the size of light guide 50 or design portion 63 viewed from the X-axis direction. In the present embodiment, light-transmissive portion 11 has a prism shape that is flat in the X-axis direction, and has substantially the same shape and size as the shapes and the sizes light guide 50 and design portion 63 viewed from the X-axis direction.

Non-light-transmissive portion 12 constitutes portions other than light-transmissive portion 11. In other words, non-light-transmissive portion 12 is disposed to surround light-transmissive portion 11, when body plate 10 is viewed in the X-axis direction. In the present embodiment, non-light-transmissive portion 12 is not in contact with light guide 50.

Moreover, non-light-transmissive portion 12 is not limited to not transmitting light at all, and may transmit a slight amount of light. At least, non-light-transmissive portion 12 has a lower light-transmitting property than light-transmissive portion 11, i.e., has a higher light-blocking property than light-transmissive portion 11.

Non-light-transmissive portion 12 is made of a white or black resin material. Note that non-light-transmissive portion 12 may have a function of reflecting light that enters from first surface 11a of light-transmissive portion 11 and is transmitted to non-light-transmissive portion 12.

<Substrate 20>

Substrate 20 is a circuit broad on which a conductive pattern is formed. Substrate 20 is disposed on a surface of body plate 10 in the negative direction of the X-axis so that substrate 20 faces body plate 10. In other words, substrate 20 is provided on a surface of body plate 10 in the negative direction of the X-axis such that substrate 20 is substantially parallel to the Y-Z plane.

On front surface 21a, which is a surface of substrate 20 that faces body plate 10, one or more first detection electrodes 30 that are electrically connected to the conductive pattern are disposed. Furthermore, on back surface 21b of substrate 20, one or more light emitters 40 are disposed.

In substrate 20, penetration hole 22 is formed at a position opposite design portion 63 via body plate 10. Penetration hole 22 is a hole that penetrates through in the X-direction, and overlaps design portion 63 via body plate 10 when viewed from the X-axis direction. Penetration hole 22 is set to a shape and a size such that light guide 50 can be disposed inside penetration hole 22.

Furthermore, substrate 20 is, for example, a flexible printed circuit board. On front surface 21a of substrate 20, a light-reflective paint material may be applied, or a light-reflective sheet or the like may be applied to reduce unnecessary light leakage. As a base material of substrate 20, for example, a film such as polycarbonate, polyethylene terephthalate, and polyimide may be used. Note that substrate 20 is not limited to the flexible printed circuit board and may be a flat substrate such as a glass epoxy board as long as body plate 10 is flat.

<First Detection Electrode 30>

First detection electrode 30 is a sensor electrode disposed on front surface 21a of substrate 20 and electrically connected to the conductive pattern formed on substrate 20. First detection electrode 30 detects, for example, a touch by a user's hand when the user touches design portion 63 with his or her hand (input to input device 1). First detection electrode 30 may be a capacitive sensor electrode, for example. First detection electrode 30 may be a transparent electrode.

Here, the meaning of the "touch" is not limited to directly touching design portion 63 by a user's hand. The meaning of the "touch" includes an indirect touch by a user's hand via an item and a state in which a space is present between design portion 63 and a user's hand, as long as first detection electrode 30 can detect a hand of a person. In other words, first detection electrode 30 detects a state in which a user's hand touches or is in proximity to design portion 63, for example.

First detection electrode 30 is electrically connected to control circuit 70 via substrate 20. First detection electrode 30 detects a touch on design portion 63 by a user and a detection signal which is a result of detection is output to control circuit 70.

Furthermore, first detection electrode 30 is interposed between substrate 20 and body plate 10, and disposed on front surface 21a of substrate 20 along the inner periphery of penetration hole 22. In other words, first detection electrode 30 is disposed at a position adjacent to penetration hole 22 and on front surface 21a of substrate 20 such that first detection electrode 30 surrounds penetration hole 22.

Figure 5:
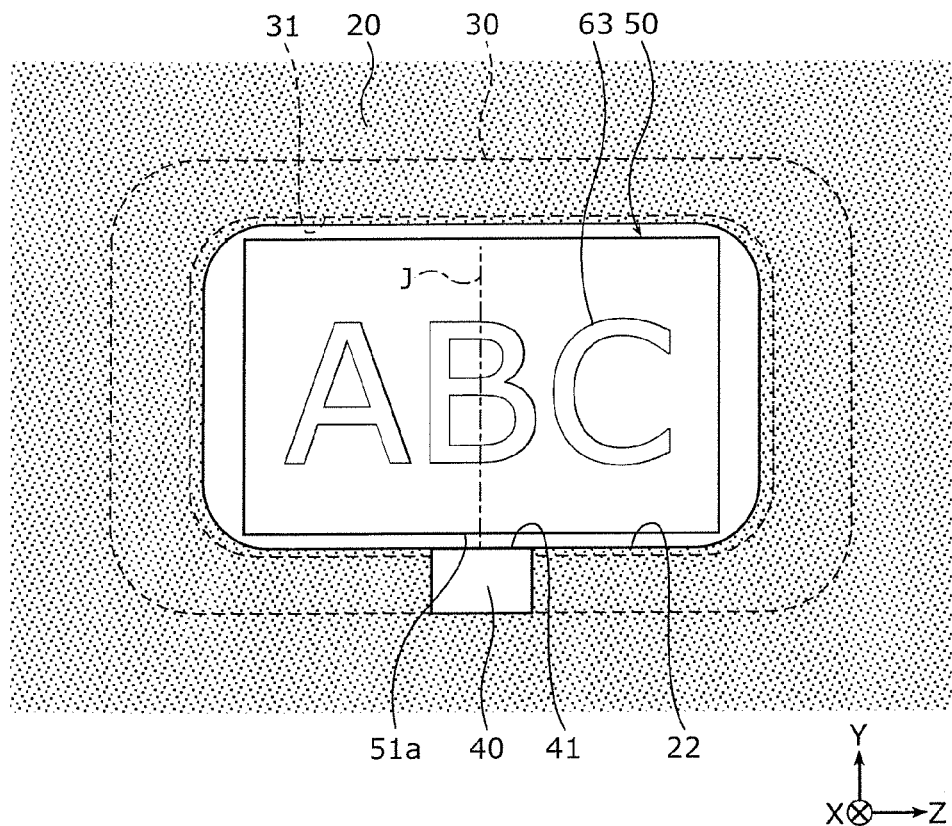
FIG. 5 is a plan view illustrating the input device according to the embodiment when viewed from a light guide.

As illustrated in FIG. 5, first detection electrode 30 in the present embodiment is formed into a loop shape surrounding penetration hole 22. FIG. 5 is a plan view illustrating input device 1 according to the embodiment when viewed from light guide 50. In this case, the shape and the size of first detection electrode 30 are set according to the shape and the size of penetration hole 22 and light guide 50 so that light guide 50 is disposed within the inner periphery of first detection electrode 30. Furthermore, opening surface 31 defined by the inner periphery of first detection electrode 30 overlaps design portion 63 and covers design portion 63 when viewed from the X-axis direction.

Note that first detection electrode 30 may be disposed in the vicinity of penetration hole 22 as long as first detection electrode 30 is capable of detecting a touch on design portion 63 by a user's hand. The configuration of surrounding penetration hole 22 and having a loop shape is not essential to first detection electrode 30. Furthermore, when first detection electrode 30 is disposed to surround penetration hole 22, a plurality of first detection electrodes 30 may be disposed discretely.

<Light Emitter 40>

As illustrated in FIG. 3 and FIG. 5, light emitter 40 is a light source disposed on back surface 21b of substrate 20, and emits light along a direction substantially parallel to back surface 21b when input to input device 1 is performed.

More specifically, light emitter 40 is disposed at a position in which the normal direction of light emitting surface 41 is parallel to back surface 21b of substrate 20 and light emitter 40 overlaps first detection electrode 30 via substrate 20 in a plan view of substrate 20 (when viewed from the X-axis direction). The normal direction of light emitting surface 41 is substantially parallel to optical axis 3 of light emitter 40. In other words, light emitter 40 is disposed in an edge of inner periphery defining penetration hole 22 such that light emitting surface 41 faces the central axis of penetration hole 22, i.e., faces light guide 50. With this configuration, light emitter 40 is disposed at a position adjacent to penetration hole 22 and emits light to light guide 50. Note that when light emitter 40 is viewed from the X-axis direction, light emitter 40 may overlap design portion 63 and light-transmissive portion 11.

Note that light emitter 40 is disposed on back surface 21b of substrate 20 so that, when body plate 10 is molded by insert molding using a resin material, light emitter 40 is protected from a highly-heated and highly-pressured molten resin material and is less likely to be affected by heat in the process of forming body plate 10.

Moreover, light emitter 40 is electrically connected to control circuit 70 via substrate 20. Light emitter 40 emits light by receiving electric power via control circuit 70, for example, to prompt a user to perform input to input device 1, i.e., input to operation interface 3. Moreover, light emitter 40 is turned on and off when input to input device 1, i.e., for example, input to operation interface 3 by a user, is performed. Furthermore, when input is performed, light emitter 40 may be in a light-on or light-off state. Here, input to operation interface 3 means that touching on design portion 63 by a user's finger, for example.

Light emitter 40 has a light-emitting element that is sealed and fixed with a white resin. The light-emitting element of light emitter 40 is disposed on substrate 20 such that the direction of optical axis 3 of the emitted light intersects light guide 50.

Light emitter 40 includes a light emitting diode (LED) as a light-emitting element, for example. Light emitter 40 emits light such as white light, blue light, red light, and green light. Note that light emitter 40 may include a light-emitting element other than the LED. For example, light emitter 40 may include an organic electroluminescent (EL) element or a bulb.

Note that when a plurality of light emitters 40 are disposed, light emitters 40 each may include the same type of light-emitting element. In this case, the same type of light-emitting element means a light-emitting element that emits light at the same luminance level when the light-emitting condition (e.g. magnitude of applied current or power) is the same.

<Light Guide 50>

Light guide 50 guides light emitted by light emitter 40 to a surface on the negative side of the X-axis of body plate 10, i.e., first surface Ha of light-transmissive portion 11. Light guide 50 is disposed on a surface on the negative side of the X-axis of body plate 10 such that light guide 50 faces light emitting surface 41 of light emitter 40 and is inserted into penetration hole 22 of substrate 20 and opening surface 31 of first detection electrode 30. In other words, light guide 50 is disposed in penetration hole 22 with incident surface 51a, which will be described later, oriented facing light emitting surface 41 of light emitter 40, and light exit surface 51b, which will also be described later, oriented facing design portion 63 with body plate 10 interposed therebetween. Note that when light guide 50 is viewed from the X-axis direction, light guide 50 overlaps design portion 63 and light-transmissive portion 11.

Light guide 50 has a prism shape that is flat in the X-axis direction, and has substantially the same shape and size as the shapes and the sizes substrate 20 and penetration hole 22 when viewed from the X-axis direction.

Light guide 50 is made of a transparent material, for example, a resin material such as an acrylic resin or polycarbonate.

Figure 6:
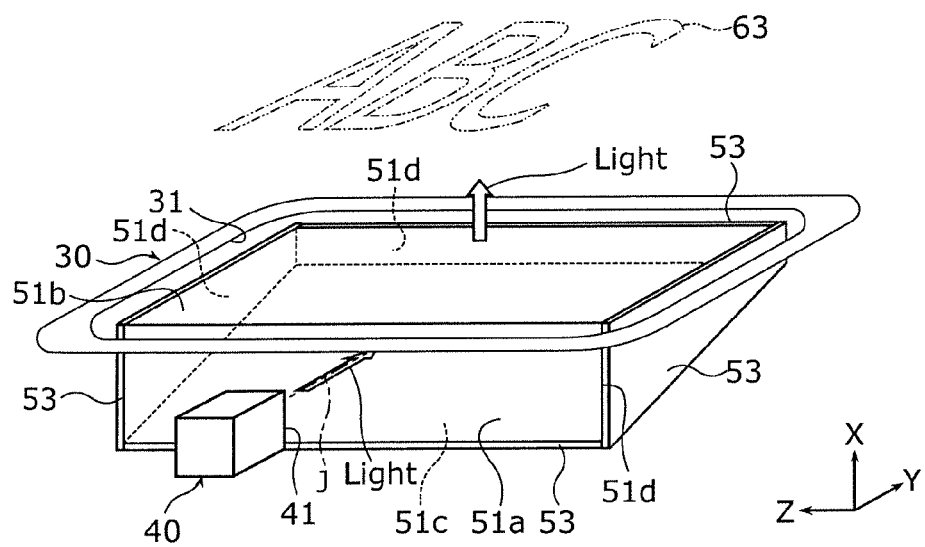
FIG. 6 is a schematic diagram illustrating an example of a light source, the light guide, and a design portion according to the embodiment.

FIG. 6 is a schematic diagram illustrating an example of light emitter 40, light guide 50, and design portion 63 according to the embodiment. In FIG. 6, illustration of body plate 10, front layer portion 60, substrate 20, etc. is omitted.

As illustrated in FIG. 6, light guide 50 has incident surface 51a, light exit surface 51b, inclined surface 51c, and a plurality of reflective side surfaces 51d.

Incident surface 51a is a surface through which light emitted by light emitter 40 enters. Furthermore, incident surface 51a is a surface that faces light emitting surface 41 of light emitter 40, and is perpendicular to optical axis J of light emitter 40. Incident surface 51a is parallel to the X-Z plane.

Light exit surface 51b is a surface from which the light that enters through incident surface 51a exits after the light passes through light guide 50. Moreover, light exit surface 51b is a surface that faces first surface 11a of light-transmissive portion 11 of body plate 10 and is in close contact with first surface 11a. In other words, the light that exits from light exit surface 51b enters first surface 11a of light-transmissive portion 11 and is transmitted through light-transmissive portion 11. Light exit surface 51b is substantially parallel to the Y-Z plane. Furthermore, light exit surface 51b overlaps design portion 63 and covers design portion 63 when viewed from the X-axis direction.

Inclined surface 51c is a surface that faces incident surface 51a and light exit surface 51b (a surface opposite incident surface 51a and light exit surface 51b), and intersects optical axis 3 of light emitter 40. Inclined surface 51c inclines upward with respect to the Y-Z plane in a direction away from light emitter 40. In other words, the distance between inclined surface 51c and optical axis J decreases in the direction away from light emitter 40 (in the positive direction of the Y-axis in FIG. 3). When inclined surface 51c is viewed from the X-axis direction, inclined surface 51c overlaps design portion 63.

Inclined surface 51c is a reflective surface that reflects light enters from incident surface 51a and passes through light guide 50 to light exit surface 51b. Inclined surface 51c according to the present embodiment is flat, but may be a free-form surface.

Reflective side surfaces 51d are surfaces other than incident surface 51a, light exit surface 51b, and inclined surface 51c, and side surfaces of light guide 50 that reflects light passing through light guide 50. More specifically, reflective side surfaces 51d are side surfaces on both sides of the Z-axis direction, and a side surface in the positive direction of the Y-axis. Reflective side surfaces 51d are one example of surfaces of light guide 50 other than incident surface 51a and light exit surface 51b.

Furthermore, light guide 50 includes light reflective layer 53. Light reflective layer 53 is disposed on each of inclined surface 51c and reflective side surfaces 51d. More specifically, each light reflective layer 53 is a reflective member that reflects light that passes through light guide 50 and is disposed on inclined surface 51c and reflective side surfaces 51d, or inclined surface 51c and reflective side surfaces 51d on which processing for reflecting light that passes through light guide 50 is performed. Here, reflection means not only total reflection of light but also includes diffuse reflection of light. Therefore, the reflective member and inclined surface 51*c* and reflective side surfaces 51*d* on which the processing for reflecting light is performed totally reflect light or diffusely reflect light.

In the present embodiment, as light reflective layer 53, a reflective member having a light-reflective function is attached to each of inclined surface 51*c* and reflective side surfaces 51*d*. Examples of light reflective layer 53 include a reflective sheet, a light reflective coat, and a light reflective film. Moreover, light reflection processing is processing of forming a reflective surface by distributing a light reflective material having a light-reflecting function on each of reflective side surfaces 51*d*, for example.

Moreover, a reflective sheet need not be formed. In this case, a reflective surface may be implemented by a refractive index difference between light guide 50 and the outside. In other words, reflective side surfaces 51*d* and inclined surface 51*c* may totally reflect light off the interface between the outside and the respective side surfaces 51*d*, and between the outside and inclined surface 51*c*.

Note that a light diffusion material may be distributed at least one of on incident surface 51*a*, on light exit surface 51*b*, on reflective side surfaces 51*d*, or inside of light guide 50. Moreover, a coloring agent may be distributed at least one of on incident surface 51*a*, on light exit surface 51*b*, on reflective side surfaces 51*d*, or inside of light guide 50. In other words, the light diffusion material and the coloring agent may be provided in an optical path from light emitter 40 to design portion 63. Both of the light diffusion material and the coloring agent may be distributed inside light guide 50, or one of the light diffusion material and the coloring agent may be selectively distributed inside light guide 50. Similarly, the light diffusion material and the coloring agent may be applied to body plate 10. Moreover, for example, the coloring agent colors light emitted by light emitter 40 to red, blue, yellow, green, etc., when the light emitted by light emitter 40 is white. For example, when the light emitted by light emitter 40 is yellow, blue coloring agent may be used to make the color of the light emitted by light emitter 40 closer to white.

<Front Layer Portion 60>

As illustrated in FIG. 3, front layer portion 60 is provided on the front surface of body plate 10. Design portion 63 is formed on front layer portion 60. In other words, front layer portion 60 includes design portion 63. Front layer portion 60 transmits light from the portion where design portion 63 is formed, and blocks light in portions other than design portion 63. In the present embodiment, front layer portion 60 allows a portion of light transmitted through light-transmissive portion 11 of body plate 10 to exit from design portion 63, and reflects the rest of the light to light guide 50. Front layer portion 60 is, for example, a paint material or a reflective sheet having a light reflecting function, and may have a light absorbing function.

Front layer portion 60 includes top layer 61 and light blocking layer 62.

Top layer 61 is a layer forming the outline of input device 1, and forming the front surface of input device 1. For example, a user's finger touches top layer 61. Top layer 61 is light transmissive and light is transmitted through top layer 61. Furthermore, top layer 61 is a resin material that simulates a wood-grain, leather-like, metal tone, or fiber-like appearance, for example. Note that wood, fiber, leather, etc. may be used as top layer 61.

Light blocking layer 62 is a layer that blocks light transmitted through body plate 10, and is between top layer 61 and body plate 10. Light blocking layer 62 is provided on the front surface of body plate 10. Light blocking layer 62 is made of a white or black resin material, for example. Light blocking layer 62 has a function of reflecting light or absorbing light.

In the present embodiment, front layer portion 60 includes design portions 63 each associated with a corresponding one of operation interfaces 3, as illustrated in FIG. 1.

As illustrated in FIG. 3, each design portion 63 is a portion through which light exits from input device 1. Design portion 63 is a portion of front layer portion 60 through which the light transmitting through body plate 10 is transmitted. Therefore, design portion 63 is light transmissive.

Design portion 63 is formed on the opposite side of body plate 10 to substrate 20. In other words, design portion 63 is provided above a surface (front surface) of body plate 10 in the positive direction of the X-axis. As illustrated in FIG. 5, design portion 63 overlaps light guide 50 when viewed from the X-axis direction, such that the light exiting light exit surface 51*b* of light guide 50 is guided to design portion 63.

In the present embodiment, design portion 63 includes part of light blocking layer 62 and part of top layer 61.

In light blocking layer 62, opening 62*a* having the same pattern as the pattern to be shown on design portion 63 is formed, and light passes through opening 62*a*. Opening 62*a* of light blocking layer 62 is formed by masking the pattern to be shown on design portion 63 and taking out the masked portion. Top layer 61 is provided on light blocking layer 62 on which the pattern shown on design portion 63 is formed. Accordingly, opening 62*a* of light blocking layer 62 is filled with top layer 61. When light enters design portion 63 from body plate 10, the light is transmitted through top layer 61 filled in opening 62*a* of light blocking layer 62, and is blocked by light blocking layer 62 other than opening 62*a*.

Moreover, top layer 61 is provided also on a surface of light blocking layer 62 in the positive direction of the Z-axis and the front surface of front layer portion 60 is made uniformly flat. Thus, design portion 63 is less likely to be identified when front layer portion 60 is viewed while light emitter 40 does not emit light.

Figure 7:
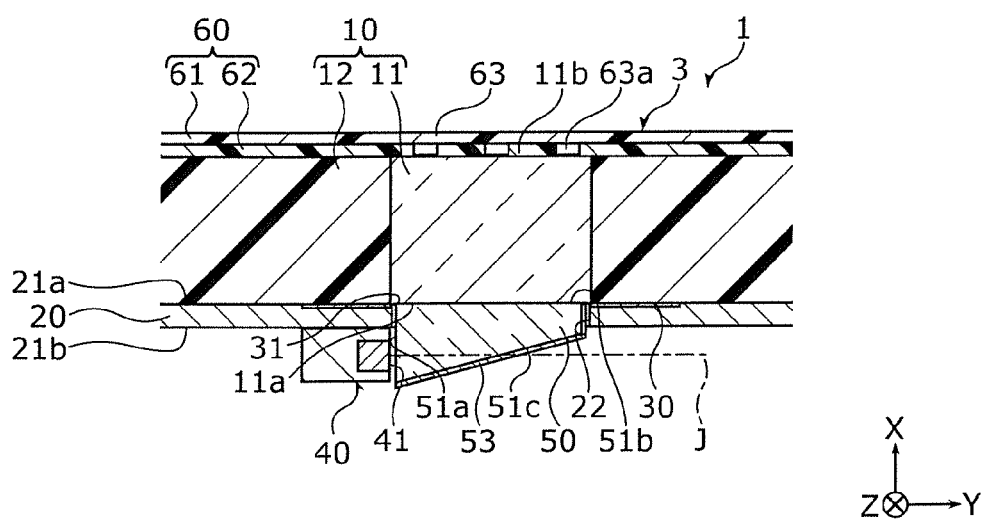
FIG. 7 is a cross-sectional view illustrating an example of a cross section of another input device.

FIG. 7 is a cross-sectional view illustrating an example of a cross section of another input device. Note that as illustrated in FIG. 7, design portion 63 may have pattern portion 63*a*, top layer 61, and light blocking layer 62, for example. Pattern portion 63*a* is a layer of a light-transmissive film or sheet provided on the front surface of body plate 10. Top layer 61 is provided on an upper surface (a surface in the positive direction of the X-axis) of pattern portion 63*a*. More specifically, after pattern portion 63*a* is provided on the front surface of body plate 10, light blocking layer 62 is provided thereon except for pattern portion 63*a*. Then, design portion 63 is provided on the upper surfaces of pattern portion 63*a* and light blocking layer 62 such that the front surface of front layer portion 60 is flat. In other words, the front surface of operation interface 3 of input device 1 is even and light is transmitted through the front surface of operation interface 3.

As another example, design portion 63 may have a protruded structure in which part of body plate 10 is protruded (protruded portion). In other words, pattern portion 63*a* and body plate 10 may be integrally formed using the same resin material.

<Control Circuit 70>

Control circuit 70 detects a touched position based on a detection signal output by first detection electrode 30. The touched position is a position touched by a user. In other words, control circuit 70 controls the device to achieve a function corresponding to the position of design portion 63 that corresponds to the detected touched position. For example, when first detection electrode 30 detects a touch on design portion 63, control circuit 70 receives a command input corresponding to the pattern shown by design portion 63 corresponding to first detection electrode 30 that has detected the touch. Control circuit 70 controls, for example, opening and closing of the storage space of storage box 100 in FIG. 1, and turning the illumination device on and off in accordance with the command received.

More specifically, control circuit 70 causes input device 1, the illumination device, etc. to operate in some operation modes. For example, control circuit 70 has an operation mode in which the storage space of storage box 100 in FIG. 1 is opened and closed, an operation mode in which the illumination device in a vehicle is turned on and off, etc. In other words, control circuit 70 causes input device 1 to rotate, the illumination device to be turn on and off, etc. in accordance with the pattern shown by design portion 63.

Moreover, control circuit 70 controls operations of light emitter 40. For example, control circuit 70 causes light emitter 40 to be turn on or off when first detection electrode 30 detects a touch on design portion 63.

Note that control circuit 70 is provided on front surface 21a of substrate 20 or back surface 21b. Note that control circuit 70 may be provided on another substrate 20 that is electrically connected to the conductive pattern of substrate 20.

[Operation]

Figure 8:
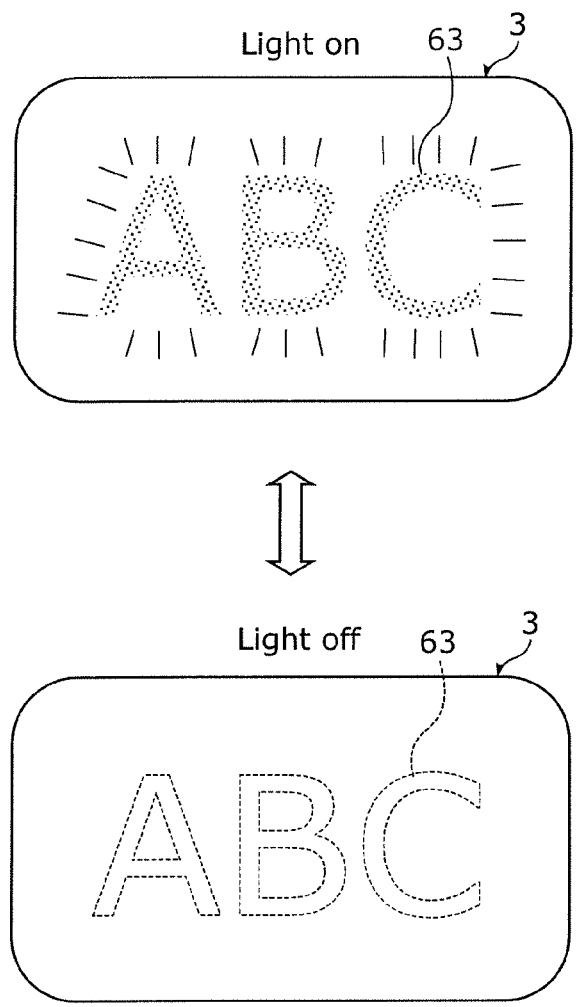
FIG. 8 is a plan view illustrating an example of light-off and light-on states of an operation interface of the input device according to the embodiment.

FIG. 8 illustrates an example of light-on and light-off states. FIG. 8 is a plan view illustrating an example of light-off and light-on states of operation interface 3 of input device 1 according to the embodiment.

As illustrated in FIG. 3 and FIG. 8, in such input device 1, when light emitter 40 emits light (is turned on), the light enters incident surface 51a of light guide 50 and passes through inside light guide 50. The light that passes through light guide 50 incidents on inclined surface 51c, etc. and is reflected to light exit surface 51b. The light exiting from light exit surface 51b enters first surface 11a of light-transmissive portion 11 of body plate 10, passes through light-transmissive portion 11, and is guided to second surface 11b of light-transmissive portion 11. In other words, the light transmitted through light-transmissive portion 11 is collected into design portion 63. A portion of the light collected into design portion 63 is transmitted through top layer 61 and exits from the front surface of front layer portion 60 and the rest of the light is blocked by light blocking layer 62.

When light emitter 40 is in the light-on state, light corresponding to the pattern on design portion 63 is emitted. Accordingly, a user can recognize the pattern on design portion 63 in the light-on state. In the light-off state, the front surface of operation interface 3 of input device 1 is flat (uniform), and thus a user cannot visually recognize or less likely to visually recognize the pattern on design portion 63.

[Working Effects]

Next, working effects of input device 1 according to the present embodiment will be described.

The input device 1 according to the present embodiment includes: substrate 20; first detection electrode 30 that is disposed on front surface 21a of substrate 20 and detects input to input device 1; light emitter 40 that is disposed on back surface 21b of substrate 20 and emits light along a direction parallel to back surface 21b when the input to input device 1 is performed; body plate 10 that is disposed on the front surface 21a side of substrate 20 and through which light emitted by light emitter 40 is transmitted; and light guide 50 that includes incident surface 51a from which light emitted by light emitter 40 enters and light exit surface 51b from which the light entered from incident surface 51a exits. Design portion 63 that is light transmissive is disposed on an opposite side of body plate 10 to substrate 20, penetration hole 22 penetrates through substrate 20 at a position opposite design portion 63 via body plate 10, and light guide 50 is disposed in penetration hole 22 with incident surface 51a oriented facing light emitting surface 41 of light emitter 40 and light exit surface 51b oriented facing design portion 63 with body plate 10 interposed between light exit surface 51b and design portion 63.

With this structure, penetration hole 22 is formed in substrate 20 at a position opposite design portion 63 via body plate 10. Since light guide 50 is disposed in penetration hole 22, the light emitted by light emitter 40 disposed on back surface 21b of substrate 20 passes through penetration hole 22 and body plate 10 via light guide 50, and is guided to design portion 63. Accordingly, increase in the optical path length from light emitter 40 to design portion 63 is suppressed in input device 1.

Therefore, it is possible to suppress luminance unevenness of light emitted through design portion 63 in input device 1.

In particular, when input device 1 is manufactured, substrate 20 on which light emitter 40, first detection electrode 30, etc. are disposed is put into a die, and body plate 10 is formed by insert molding using a resin material to obtain input device 1. In this case, light emitter 40 is disposed on back surface 21b of substrate 20. With this, light emitter 40 is less likely to be affected by a highly-heated and highly-pressured molten resin material.

Moreover, in input device 1 according to the present embodiment, first detection electrode 30 is disposed along an inner periphery of penetration hole 22.

With this, first detection electrode 30 is disposed near penetration hole 22. This ensures detection of a touch by, for example, a user's finger on design portion 63.

Moreover, in input device 1 according to the present embodiment, first detection electrode 30 has a loop shape surrounding penetration hole 22 and is disposed on front surface 21a of substrate 20.

This enables more reliable detection of a touch on design portion 63 by a user's finger, even when the user's finger touches a position slightly deviated from design portion 63, for example.

Moreover, in input device 1 according to the present embodiment, light guide 50 includes inclined surface 51c that faces incident surface 51a and light exit surface 51b, and inclined surface 51c is a reflective surface that reflects, to light exit surface 51b, light that enters incident surface 51a and passes through light guide 50.

With this, inclined surface 51c reflects light that enters from incident surface 51a and passes through light guide 50 to light exit surface 51b. The light that is reflected off inclined surface 51c is guided to design portion 63 via light exit surface 51b and body plate 10. Therefore, design portion 63 emits bright light. As a result, the design (pattern) on design portion 63 appears.

Moreover, in input device 1 according to the present embodiment, on inclined surface 51c, light reflective layer 53 that reflects light that passes through light guide 50 is disposed or light reflective processing for reflecting light that passes through light guide 50 is performed.

This ensures that inclined surface 51c reflects light that enters from incident surface 51a and passes through light guide 50 to light exit surface 51b. With this, the light reflected off inclined surface 51c is guided to design portion 63 via light exit surface 51b and body plate 10. Therefore, design portion 63 emits brighter light. As a result, the design (pattern) on design portion 63 appears more reliably.

Moreover, in input device 1 according to the present embodiment, on surfaces other than incident surface 51a and light exit surface 51b, light reflective layer 53 that reflects light that passes through light guide 50 is disposed or light reflective processing for reflecting light that passes through light guide 50 is performed.

With this, not only inclined surface 51c but also surfaces other than incident surface 51a and light exit surface 51b of light guide 50 reflect light that enters from incident surface 51a and passes through light guide 50. Therefore, the light that enters from incident surface 51a and passes through light guide 50 can be collected on light exit surface 51b. With this, more light can be collected into design portion 63 via light exit surface 51b and body plate 10. Therefore, design portion 63 emits bright light more reliably. As a result, design portion 63 emits bright light, and thus the pattern on design portion 63 appears more clearly.

Moreover, in input device 1 according to the present embodiment, body plate 10 is a portion interposed between design portion 63 and light exit surface 51b of light guide 50, and includes light-transmissive portion 11 that has a light-transmitting property and a non-light-transmissive portion 12 that has a non-light-transmitting property and constitutes a portion other than light-transmissive portion 11.

With this, light-transmissive portion 11 is disposed at a position in which light-transmissive portion 11 overlaps design portion 63 and light guide 50. Thus, the light that exits from light exit surface 51b of light guide 50 is reliably guided to design portion 63. Moreover, the portion other than light-transmissive portion 11 is non-light-transmissive portion 12. Therefore, more light can be collected into design portion 63 opposite light guide 50 of light-transmissive portion 11. Because of this, design portion 63 emits bright light more reliably, and the pattern on design portion 63 appears more clearly.

In input device 1 according to the present embodiment, body plate 10 includes light-transmissive portion 11 and non-light-transmissive portion 12 that are integrally formed by multicolor molding.

With this, body plate 10 can be manufactured by multicolor molding. Therefore, body plate 10 is manufactured more easily than separately manufacturing light-transmissive portion 11 and non-light-transmissive portion 12 and combining light-transmissive portion 11 and non-light-transmissive portion 12.

In input device 1 according to the present embodiment, light emitter 40 is disposed at a position in which the normal direction of light emitting surface 41 is parallel to back surface 21b of substrate 20 and light emitter 40 overlaps first detection electrode 30 in a plan view of substrate 20.

With this structure, for example, first detection electrode 30 is disposed in the vicinity of design portion 63 to detect a touch on design portion 63 by a user's finger and light emitter 40 can be disposed near such first detection electrode 30. In other words, in input device 1, light emitter 40 can be disposed near design portion 63. Accordingly, the optical path length from light emitter 40 to design portion 63 is less likely to be long. As a result, it is possible to further suppress luminance unevenness of light emitted through design portion 63 in input device 1.

Other Variations

One or more aspects of the present disclosure have been described above on the basis of the embodiment, but the present disclosure is not limited to the input device.

For example, in the input device according to the embodiment, the design portion may be formed by a patterning process of a two-color molding resin or a coating film using laser, a mask process (such as screen printing), an in-mold transfer printing process, a three dimension overlay method (TOM) process, an insert molding, etc. Note that the forming of the design portion is not limited to the above, and other known means may be employed.

Although the input device according to the embodiment is described that the body plate is formed by putting the substrate in a die, and performing insert molding using a resin material, the input device is not limited to the above configuration. The substrate may be attached to the body plate with a double-sided tape or an adhesive agent after the body plate is formed.

Moreover, for example, when the input device according to the above embodiment is applied to an arm rest or the like, a touch pad may be employed as a detection electrode.

In the input device according to the embodiment, the control circuit may be energized from a battery, etc. For example, the electrical power may be supplied to the control circuit from a power source of the vehicle or the commercial power supply.

Furthermore, the input device according to the embodiment may be applied to not only the cover of the storage box, but also, for example, an input device provided to an arm rest or an inner door surface which requires a thinner input device.

Figure 9:
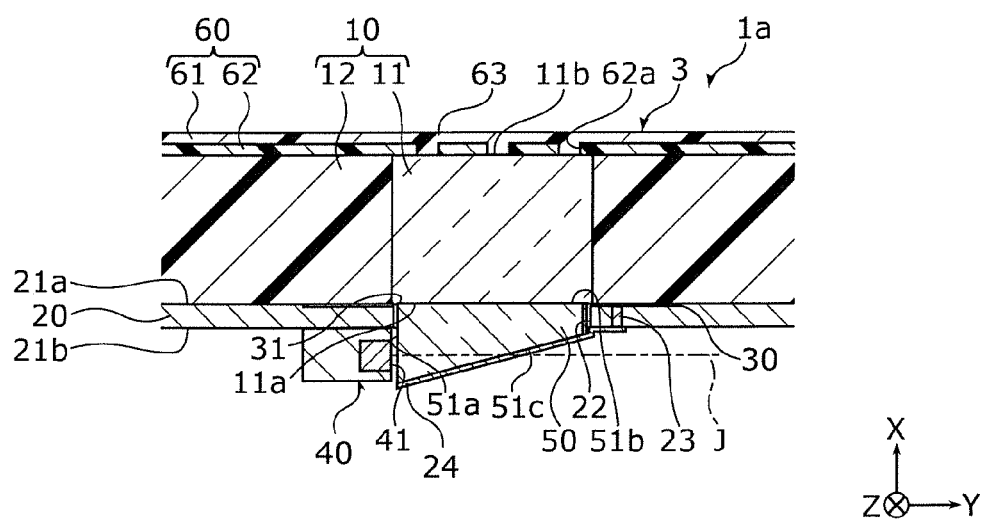
FIG. 9 is a cross-sectional view illustrating a cross section of another input device according to other variations.

Furthermore, in input device 1a according to the embodiment, as illustrated in FIG. 9, the light reflective layer (reflective member) disposed on inclined surface 51c of light guide 50 may be second detection electrode 24 that is conductive. Second detection electrode 24 may be a capacitive sensor electrode disposed on inclined surface 51c, for example. Second detection electrode 24 may be electrically connected to first detection electrode 30. Furthermore, through hole 23 electrically connected to first detection electrode 30 may be formed in substrate 20. Furthermore, second detection electrode 24 may be electrically connected to through hole 23. FIG. 9 is a cross-sectional view illustrating a cross section of input device 1a according to other variations.

As described in the embodiment, a reflective sheet is formed as light reflective layer 53 on inclined surface 51c of light guide 50. In input device 1a in FIG. 9, the reflective sheet is made of a metal foil tape (or a sheet, a film, etc.), for example. The metal foil tape is attached to inclined surface 51c. The front surface of the metal foil tape is a surface that faces inclined surface 51c and that is attached to inclined surface 51c. The front surface of the metal foil tape has a metallic luster. Therefore, the metal foil tape functions as the above-described light reflective layer.

Because the metal foil tape is electrically connected to first detection electrode 30, the metal foil tape not only functions as the above-described light reflective layer, but also as second detection electrode 24. In other words, since second detection electrode 24 is disposed on substantially the entire surface of inclined surface 51c, it is possible to obtain a configuration corresponding to a configuration in which the area of first detection electrode 30 is expanded, compared with the configuration in which second detection electrode 24 is not used as the light reflective layer. Accordingly, this increases the sensitivity of detecting a touch on design portion 63 by a user's finger.

Furthermore, in input device 1a in FIG. 9, through hole 23 electrically connected to first detection electrode 30 is formed in substrate 20. Although input device 1a in FIG. 9 has a configuration in which first detection electrode 30 and through hole 23 overlap each other (overlap in the X-axis direction), the present disclosure is not limited to this configuration. Input device 1a may have a configuration in which first detection electrode 30 and through hole 23 are spaced apart from each other (disposed without overlapping each other in the X-axis direction), and first detection electrode 30 and through hole 23 are connected to each other by a wiring pattern of substrate 20.

Through hole 23 is provided with a conductor that passes through substrate 20 to electrically connect the front surface and the back surface of substrate 20, i.e., through hole 23 is not a non-plated through hole. Therefore, first detection electrode 30 and second detection electrode 24 can be electrically connected by electrically connecting second detection electrode 24 to through hole 23.

As described above, since first detection electrode 30 and second detection electrode 24 are electrically connected via through hole 23, this makes it possible to use minimum wiring required to connect first detection electrode 30 and second detection electrode 24, and minimize protrusion of the wiring which may occur by excessive drawing of the wiring. As a result, it is possible to maintain a thin structure of the input device.

Although in the above-described input device 1a, the light reflective layer serves as second detection electrode 24, second detection electrode 24 may be provided on the front surface of the light reflective layer.

The input device according to one or more aspects of the present disclosure has been described above on the basis of the embodiment, but the present disclosure is not limited to the embodiment. One or more aspects of the present disclosure may include, without departing from the essence of the present disclosure, a variation achieved by making various modifications to the present disclosure that can be conceived by those skilled in the art or an embodiment achieved by combining structural elements in different embodiments.

While an embodiment has been described herein above, it is to be appreciated that various changes in form and detail may be made without departing from the spirit and scope of the present disclosure as presently or hereafter claimed.

Further Information about Technical Background to this Application

The disclosures of the following Japanese Patent Applications including specification, drawings and claims are incorporated herein by reference in their entirety: Japanese Patent Application No. 2019-197075 filed on Oct. 30, 2019, and Japanese Patent Application No. 2020-094012 filed on May 29, 2020.

INDUSTRIAL APPLICABILITY

The present disclosure is useful as an input device and the like capable of outputting light having less luminance unevenness from the design portion of the input device.

What is claimed is:

1. An input device, comprising:
a substrate;
a first detection electrode that is disposed on a front surface side of the substrate and detects input to the input device;
a light emitter that is disposed on a back surface of the substrate and emits light along a direction parallel to the back surface when the input to the input device is performed;
a body plate that is disposed on the front surface side of the substrate and through which light emitted by the light emitter is transmitted; and
a light guide that includes an incident surface from which light emitted by the light emitter enters and a light exit surface from which the light entered from the incident surface exits, wherein
a design portion that is light transmissive is disposed on an opposite side of the body plate to the substrate,
a penetration hole penetrates through the substrate at a position opposite the design portion via the body plate,
the first detection electrode is disposed along an inner periphery of the penetration hole,
the light guide is disposed in the penetration hole with the incident surface oriented facing a light emitting surface of the light emitter and the light exit surface oriented facing the design portion with the body plate interposed between the light exit surface and the design portion,
the light guide includes an inclined surface that faces the incident surface and the light exit surface, and
the inclined surface is a reflective surface that reflects, to the light exit surface, light that enters the incident surface and passes through the light guide.

2. The input device according to claim 1, wherein the first detection electrode has a loop shape surrounding the penetration hole and is disposed on the front surface side of the substrate.

3. The input device according to claim 1, wherein on the inclined surface, a reflective member that reflects light that passes through the light guide is disposed.

4. The input device according to claim 1, wherein on surfaces other than the incident surface and the light exit surface, a reflective member that reflects light that passes through the light guide is disposed.

5. The input device according to claim 1, wherein the light emitter is disposed at a position in which a normal direction of the light emitting surface is parallel to the back surface of the substrate and the light emitter overlaps the first detection electrode in a plan view of the substrate.

6. The input device according to claim 3, wherein the reflective member is disposed on the inclined surface, the reflective member is a second detection electrode that is conductive, and
the second detection electrode is electrically connected to the first detection electrode.

7. The input device according to claim 6, wherein a through hole that is electrically connected to the first detection electrode is provided in the substrate, and
the second detection electrode is electrically connected to the through hole.

8. The input device according to claim 1, wherein surfaces other than the incident surface and the light exit surface are configured to permit passing of reflected light through the light guide.

9. The input device according to claim 1, wherein the inclined surface is processed to reflect light that passes through the light guide.

10. The input device according to claim 1, wherein surfaces other than the incident surface and the light exit surface are processed to reflect light that passes through the light guide.

11. An input device, comprising:

a substrate;

a first detection electrode that is disposed on a front surface side of the substrate and detects input to the input device;

a light emitter that is disposed on a back surface of the substrate and emits light along a direction parallel to the back surface when the input to the input device is performed;

a body plate that is disposed on the front surface side of the substrate and through which light emitted by the light emitter is transmitted; and a light guide that includes an incident surface from which light emitted by the light emitter enters and a light exit surface from which the light entered from the incident surface exits, wherein a design portion that is light transmissive is disposed on an opposite side of the body plate to the substrate, a penetration hole penetrates through the substrate at a position opposite the design portion via the body plate, the light guide is disposed in the penetration hole with the incident surface oriented facing a light emitting surface of the light emitter and the light exit surface oriented facing the design portion with the body plate interposed between the light exit surface and the design portion, and the body plate is a portion interposed between the design portion and the light exit surface of the light guide, and includes a light-transmissive portion that has a light-transmitting property and a non-light-transmissive portion that has a non-light-transmitting property and constitutes a portion other than the light-transmissive portion.

12. The input device according to claim 11, wherein the body plate includes the light-transmissive portion and the non-light-transmissive portion that are integrally formed by multicolor molding.

* * * * *